United States Patent [19]
Venkatesan et al.

[11] Patent Number: 5,863,598
[45] Date of Patent: *Jan. 26, 1999

[54] METHOD OF FORMING DOPED SILICON IN HIGH ASPECT RATIO OPENINGS

[75] Inventors: Mahalingam Venkatesan, San Jose; Shulin Wang; Vedapuram S. Achutharaman, both of Santa Clara, all of Calif.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 631,922

[22] Filed: Apr. 12, 1996

[51] Int. Cl.$^6$ .................................................. C23C 16/24
[52] U.S. Cl. ........................ 427/97; 427/99; 427/255.2; 427/255.7; 148/DIG. 1; 148/DIG. 122; 438/668; 438/680; 438/684
[58] Field of Search ........................... 427/97, 99, 248.1, 427/255.1, 255.2, 255.7; 437/233; 148/DIG. 1, DIG. 122; 438/668, 680, 684

[56] References Cited

U.S. PATENT DOCUMENTS

| | | | |
|---|---|---|---|
| 3,484,311 | 12/1969 | Benzing | 148/174 |
| 4,466,992 | 8/1984 | Dreiling | 427/39 |
| 4,742,020 | 5/1988 | Roy | 437/61 |
| 5,080,933 | 1/1992 | Grupen-Shemansky et al. | 427/255.1 |
| 5,141,892 | 8/1992 | Beinglass | 437/162 |
| 5,590,051 | 12/1996 | Yokozawa | 364/496 |
| 5,607,724 | 3/1997 | Beinglass et al. | 427/255.1 |
| 5,614,257 | 3/1997 | Beinglass et al. | 427/248.1 |

FOREIGN PATENT DOCUMENTS 813025855  6/1981  European Pat. Off. .

OTHER PUBLICATIONS

H.M. Branz, et al.; "Hydrogenated Amorphous Silicon Prepared by Laser–Induced Chemical Vapor Deposition of Silane for Solar–Cell Applications"; *Eighteenth IEEE Photovoltaic Specialists Conference—1985*; Oct. 21–25, 1985; pp. 513–518.

W.A. Bryant; "The Kinetics of the Deposition of Silicon by Silane Pyrolysis at Low Temperatures and Atmospheric Pressure"; *Thin Solid Films*, 60 (1979) pp.19–25, (no month).

Jitendra S. Goela & Raymond L. Taylor; "Monolithic Material Fabrication by Chemical Vapour Deposition"; *Journal of Materials Science* 23 (1988); pp. 4331–4339, (no month).

*Primary Examiner*—Michael Lusignan
*Assistant Examiner*—Timothy Meeks

[57] ABSTRACT

A method of forming a doped silicon film on a substrate. According to the present invention, a substrate is placed in a reaction chamber and heated. Next, a silicon containing gas is fed into the reaction chamber to produce a silicon containing gas partial pressure of between 4 and 20 torr.

20 Claims, 10 Drawing Sheets

METHOD OF FORMING DOPED SILICON IN HIGH ASPECT RATIO OPENINGS

BACKGROUND OF THE INVENTION

1. Field of the Invention

The present invention relates to the field of semiconductor fabrication, and more particularly, to a method and apparatus for depositing amorphous and polysilicon films with improved step coverage.

2. Discussion of Related Art

Polysilicon crystalline (polysilicon) and amorphous silicon thin films are used throughout the many semiconductor integrated circuit manufacturing processes. These films are used, for example, in the fabrication of gate electrodes, stack or trench capacitors, emitters, contacts, fuses, and antifuses. As device dimensions decrease to below 0.25 microns in order to increase packing density, aspect ratios (aspect ratio=depth/width) of holes, vias, and trenches in the integrated circuit are also increasing. In order to fill high aspect ratio openings (aspect ratios$\geq$to 2.5), deposition processes which are capable of good step coverage (step coverage %=film thickness on a step surface/film thickness on a flat surface×100%) are required to ensure complete hole filling without the creation of voids.

One current method which can provide adequate step coverage is low pressure chemical vapor deposition (LPCVD). In LPCVD processes, reaction vessels are evacuated to relatively low pressures of between 100–1000 mtorr. The low pressures associated with LPCVD processes cause silicon films to be deposited at low rates (about 100 angstroms (Å)/minute for undoped films and about 20 Å/minute for doped films). The low deposition rates enable the films to be deposited with good step coverage. When n-type dopants are introduced in a LPCVD batch system to produce an insitu doped film, poor step coverage results. Further reducing the deposition rate is necessary to get good step coverage. Although LPCVD processes can form high quality films, their low deposition rates necessitate the processing of multiple wafers (i.e. up to 100) at one time in a batch type reaction vessel. A problem with processing a plurality of wafers in a single machine at a single time is that it is difficult to obtain uniform film thicknesses and dopant compositions from wafer to wafer and from batch to batch. Nonuniformity in film thickness and doping profiles can drastically affect the electrical characteristics of the fabricated film and therefore, the performance and reliability of the fabricated device. Controlling film thickness and sheet resistance uniformity will be an even greater challenge for LPCVD batch systems when wafer size is increased to 300 mm and above.

To fabricate polysilicon and amorphous silicon films with precise thickness and doping uniformity across a wafer and from wafer to wafer, single wafer CVD processes are used. A single wafer CVD process for producing a silicon layer on a silicon wafer is described in U.S. Ser. No. 07/742,954, filed Aug. 9, 1991, entitled Low Temperature High Pressure Silicon Deposition Method and is assigned to the present assignee. In such a process, a pressure between 10–350 torr is achieved and maintained in a reaction chamber. Hydrogen gas at about 10 liters/minutes is fed into the chamber along with less than 525 sccm of silane ($SiH_4$) (silane partial pressure is less than 4 torr) while the substrate is heated to a temperature of between 600°–750° C. An undoped polysilicon film is deposited under these conditions at a rate of up to about 2000 Å/minute. The higher pressure used in the single wafer method increases deposition rate of the polysilicon film. A phosphorous insitu doped polysilicon film can be deposited by including 300 sccm of 1% phosphine ($PH_3$) in hydrogen ($PH_3$ partial pressure of about 0.023 torr) into the gas mix and by heating the substrate to a temperature of about 650° C. With such a process, a polycrystalline silicon film containing about $1.5 \times 10^{21}/cm^3$ of phosphorous can be deposited at a rate of up to about 1500 Å/minute.

A problem with the above referenced single wafer CVD processes is that step coverage is poor and so cannot be used to fill high aspect ratio openings without causing the formation of voids. Voids can cause reliability problems and failures in the fabricated integrated circuits. Additionally, if dopants are included into the gas mix to form a low resistivity insitu doped silicon film, step coverage becomes even worse.

Thus, what is desired is a method for depositing in a single wafer CVD apparatus and insitu doped silicon film at a high deposition rate and with good step coverage so that high aspect ratio openings can be filled void free in a manufacturable amount of time.

SUMMARY OF THE INVENTION

The present invention describes a method and apparatus for depositing, at a high deposition rate, a high quality, uniform, amorphous silicon and polysilicon films with good step coverage across the surface of a substrate. According to the present invention, a substrate is placed into a single wafer chemical vapor deposition reaction chamber. The reaction chamber is then evacuated to a reduced pressure of between 20–300 torr. The substrate is then heated to a temperature between 550°–620° C. Next, a silicon containing gas is fed into the reaction chamber to produce a partial pressure of silicon containing gas of between 4 and 40 torr. A dopant gas can be included in the gas mix to produce a dopant gas partial pressure of between 0–0.020 torr in order to provide an insitu doped silicon film. A subsequent anneal can be used to convert amorphous silicon into polycrystalline silicon, if desired. The process of the present invention can be used to form amorphous silicon and polysilicon films with uniform thickness and dopant profiles. The process of the present invention can be used to form amorphous silicon and polysilicon with improved step coverage in high aspect ratio openings and to optimize the process. The process of the present invention can be used to fill high aspect ratio openings with amorphous or polycrystalline silicon ($\geq 2.0$) without creating voids therein.

DETAILED DESCRIPTION OF THE PRESENT INVENTION

Figure 1A:
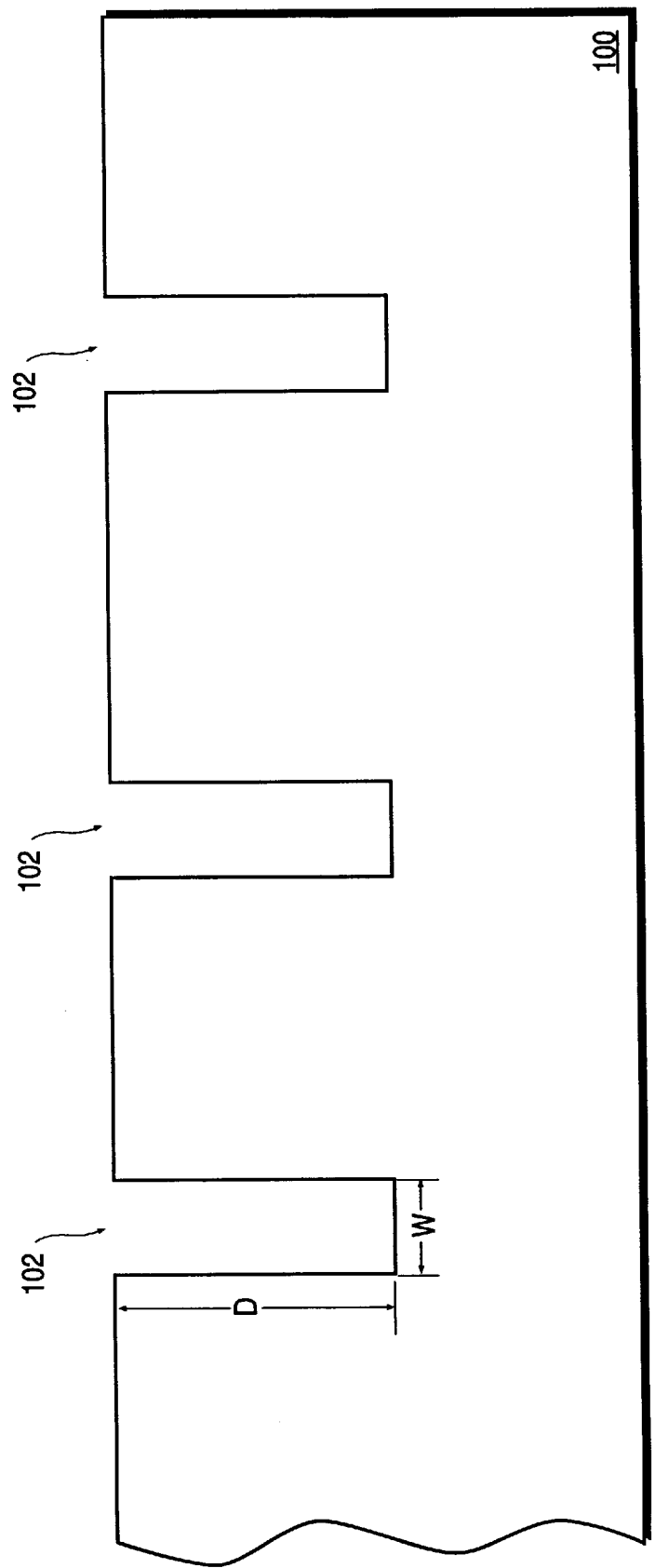
FIG. 1*a* is an illustration of a cross-sectional view of a substrate having a high aspect ratio opening formed therein.
Figure 1B:
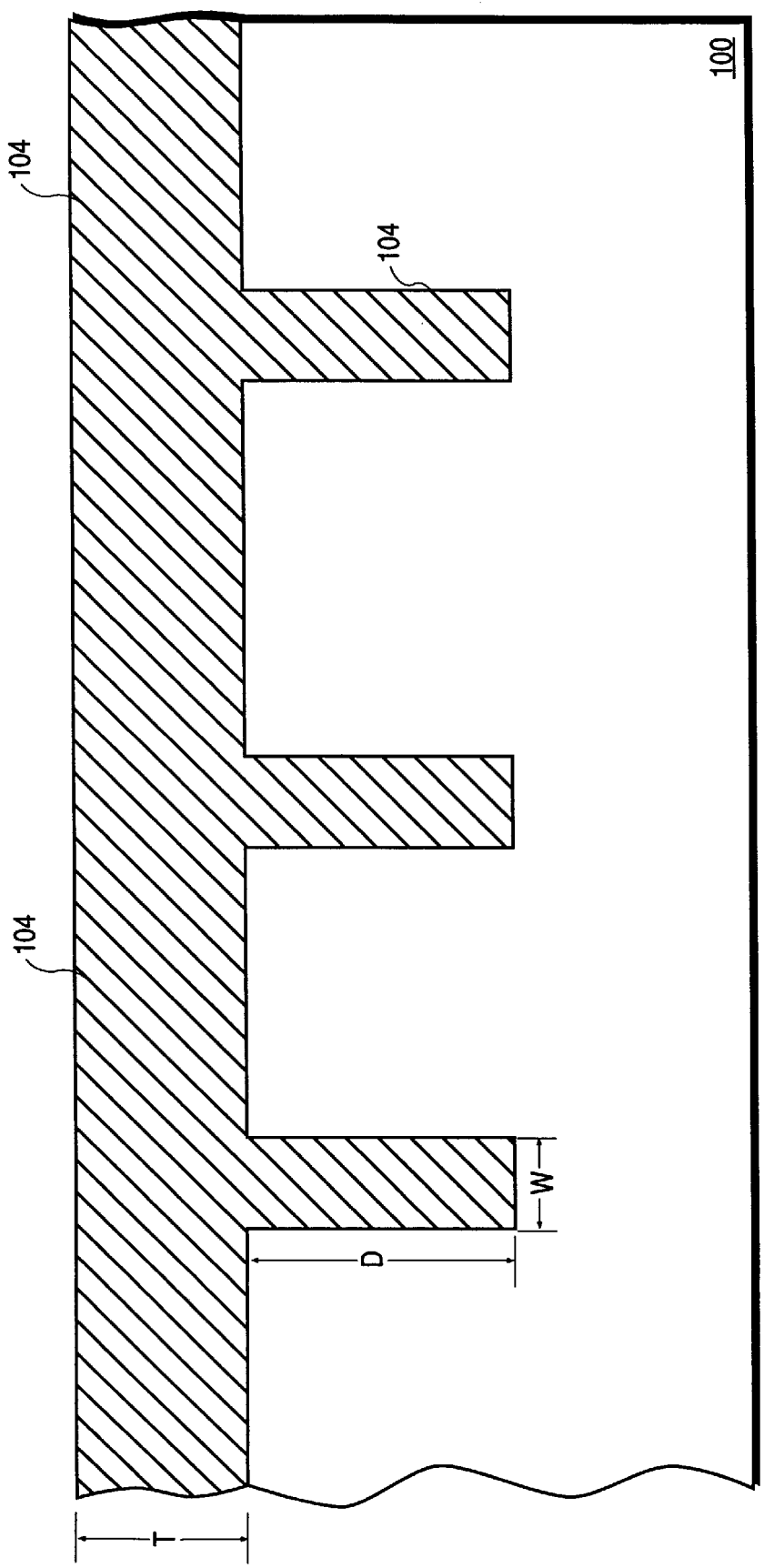
FIG. 1*b* is an illustration of a cross-sectional view showing the formation of a silicon layer over the substrate of FIG. 1*a*.

The present invention describes a method and apparatus for depositing an insitu doped amorphous silicon or polysilicon thin film at a high deposition rate and with improved step coverage. In the following description, numerous specific details are set forth such as specific thicknesses, etc. in order to provide a thorough understanding of the present invention. It will be obvious, however, to one skilled in the art, that the present invention may be practiced without these specific details. In other instances, well known chemical vapor deposition (CVD) equipment and processes have not been described in particular detail in order to not unnecessarily obscure the present invention.

The present invention describes a method and apparatus for depositing, at a high deposition rate, a high quality, uniform, amorphous silicon or polycrystalline silicon (polysilicon) film with good step coverage, across the surface of a substrate. The present invention utilizes a high total pressure, a high silicon gas partial pressure, and reduced temperature to achieve good step coverage. According to the present invention, a substrate is placed into a single wafer chemical vapor deposition reaction chamber. The reaction chamber is then evacuated to a reduced pressure between 20–300 torr. The substrate is then heated to a temperature between 550°–620° C. Next, a silicon containing gas is fed into the reaction chamber at rates of between 500–1500 sccm and to produce a silicon containing gas partial pressure between 4 and 40 torr. A dopant gas can be fed into the reaction chamber at a rate between 0–2.0 sccm to produce a dopant gas partial pressure between 0–0.020 torr. An anneal step can be used to convert amorphous silicon into polycrystalline silicon, if desired. The process of the present invention can be used to deposit amorphous silicon and polysilicon thin films having uniform thickness and doping profiles and a smooth top surface. The process of the present invention can be used to fill high aspect ratio openings ($\geq 2.0$) at a high deposition rate ($\approx 1000$ Å/minute) without creating voids therein.

According to the present invention, a substrate 100 is provided. Substrate 100 is preferably a monocrystalline silicon wafer. Substrate 100, however, need not necessarily be a silicon wafer and may be other types of substrates such as gallium arsenide or quartz. Substrate 100 typically will include a plurality of spaced apart features or holes 102. Features 102 can be due to, but not limited to, trenches formed in a substrate, field oxide regions grown on a substrate, and contact and via openings formed in an interlayer dielectric (ILD). The process of the present invention is ideally suited for depositing silicon films in high aspect ratio openings during the formation of trench and/or stacked capacitors in the manufacture of modern high density dynamic random access memories (DRAMS). Although the present invention is ideally suited for use in the manufacture of integrated circuits, the present invention is equally applicable to the fabrication of other products, such as but not limited to, flat panel displays. For the purpose of the present invention, a substrate 100 is defined as the material onto which a silicon film of the present invention is deposited.

The method of the present invention will be described and illustrated with respect to the flow chart of FIG. 2. According to the first step of the present invention, as shown in block 200, a substrate, such as substrate 100, is placed into a single substrate reactor 300, such as shown in FIG. 3. The single substrate reactor 300, shown in FIG. 3, has a top 312, sidewalls 314, and a bottom 318 that define a chamber 319 into which a single wafer or substrate 100 can be loaded. Chamber 319 is designed to handle wafers up to 200 mm and has a volume of approximately ten liters, such as used in the Applied Material's Centura single wafer chamber tool. It is to be appreciated that larger volume chambers for handling larger wafers, such as 300 mm, may be used, if desired. Additionally, all flow rates provided herein are with respect to a ten liter chamber and one skilled in the art will recognize the need to scale flow rates for different volume reactors. What is important is to utilize the partial pressures of the gases provided herein.

Substrate 100 is mounted on a pedestal or susceptor 322 that is rotated by a motor (not shown) to provide a time average environment for the substrate 100 that is cylindrically symmetric. A susceptor circumscribing preheat ring 324 is supported by sidewall 314 and surrounds susceptor 322 and substrate 100. Lifting fingers 323 pass through holes (not shown) form through susceptor 322 to engage the underside of substrate 100 to lift it off susceptor 322. Substrate 100 and preheat ring 324 are heated by a light from a plurality of high intensity lamps 326 mounted outside of reactor 310. High intensity lamps 326 are preferably tungsten halogen lamps which produce infrared (IR) light at a wavelength of approximately 1.1 microns. The top 312 and bottom 318 of reactor 310 are substantially transparent to light to enable light from external lamps 326 to enter reactor 300 and heat susceptor 322, substrate 100 and preheat ring 324. Quartz is used for the top 312 and the bottom 318 because it is transparent to light of visible and IR frequency; because it is relatively high strength material that can support a large pressure difference across it; and because it has a low rate of outgassing. A suitable top temperature sensor and a suitable bottom temperature sensor, such as pyrometers, are positioned to measure the temperature of substrate 100 and the temperature of susceptor 322, respectively.

Figure 2:
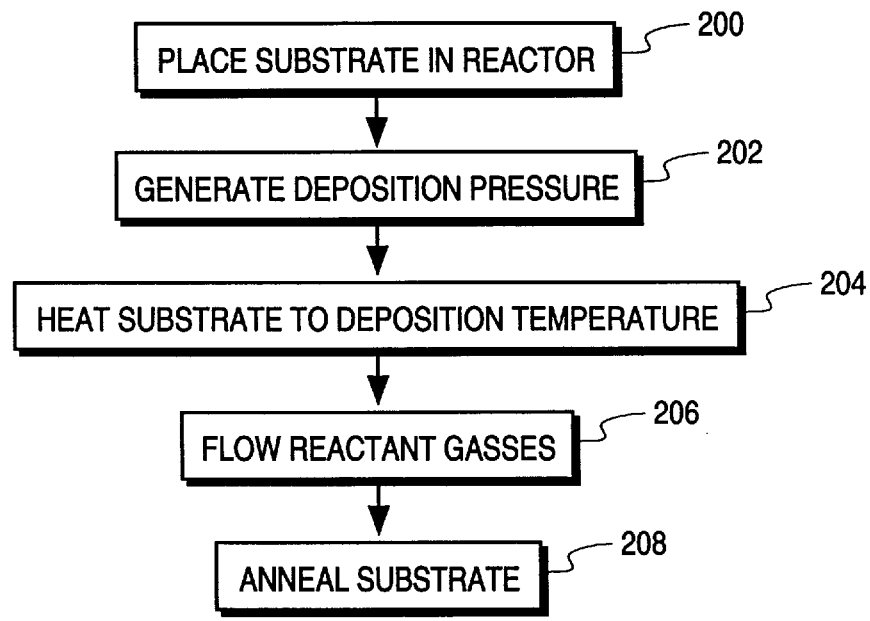
FIG. 2 is a flow chart which illustrates the silicon deposition process of the present invention.
Figure 3:
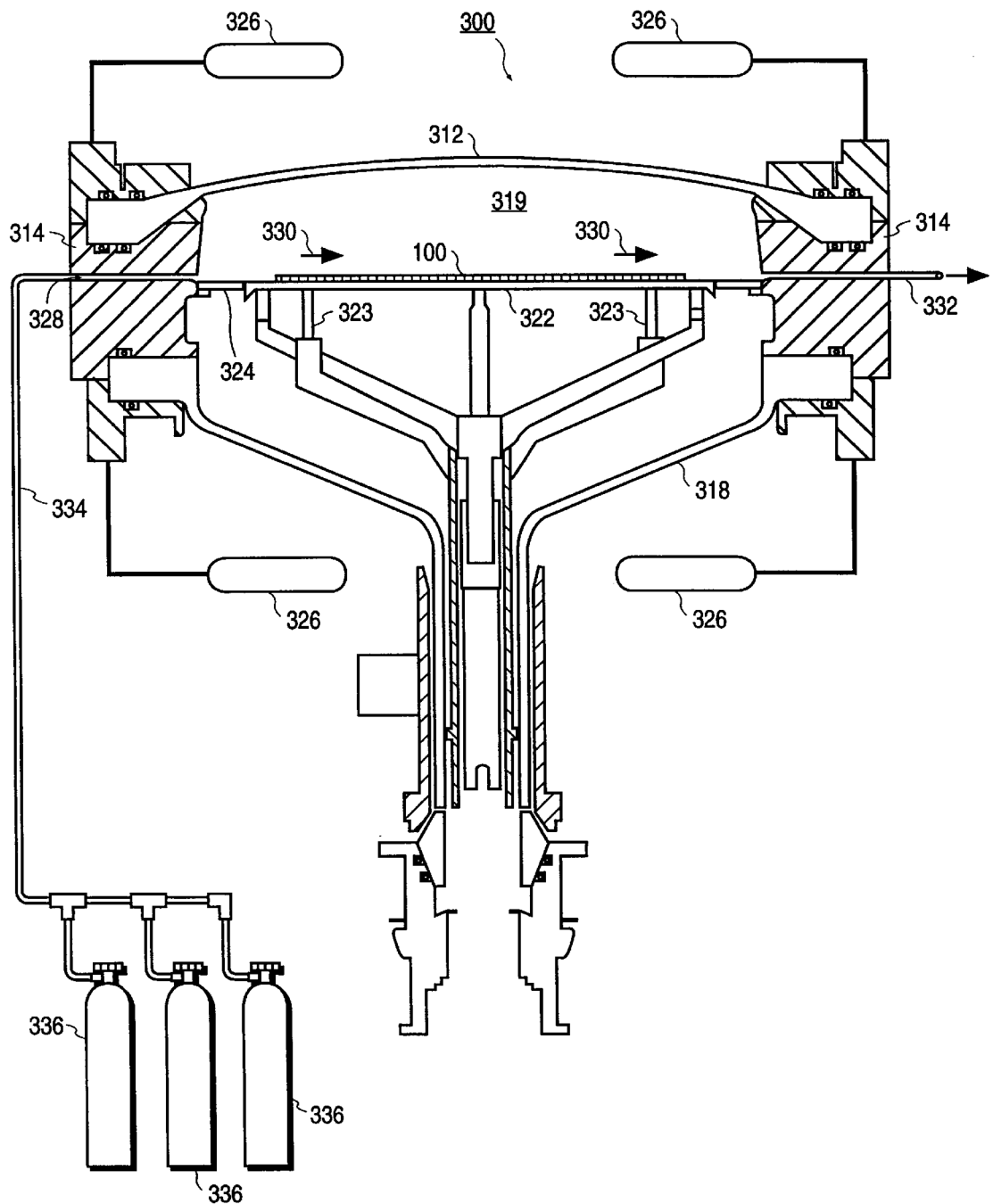
FIG. 3 is an illustration of a single wafer chemical vapor deposition reactor.

Next, according to block 202 of FIG. 2, chamber 319 is evacuated through exhaust port 332 by a pump (not shown) to reduce the pressure in chamber 319 from atmospheric pressure to a deposition pressure. The deposition pressure is the total pressure within chamber 319 when a silicon film of the present invention is deposited. The present invention utilizes a relatively high deposition pressure in order to increase the deposition rate with improved step coverage. The deposition pressure of the present invention is between 20–300 torr, with a pressure of between 150–200 torr being preferred. The higher the deposition pressure, the higher will be the deposition rate. An increase in deposition pressure, increases the step coverage of the process at a fixed growth rate.

Next, as illustrated in block 204, substrate 100, preheat ring 324, and susceptor 322 are heated by lamps 326 to a deposition temperature between 550°–620° C. with approximately 590°–600° C. being preferred. As the deposition temperature decreases, the deposition rate decreases and step coverage improves. The exact crystallographic nature of the deposited silicon depends upon the deposition temperature. The relatively low deposition temperatures utilized in the present invention deposits only amorphous silicon, however at higher deposition temperatures (greater than 610° C.), some polysilicon can be incorporated into the film.

Next, as shown in block 206 of FIG. 2, reactant gases are fed into reaction chamber 319. The deposition pressure and temperature are maintained within the specified ranges while reactant gases flow into reaction chamber 319 to deposit a silicon film. During deposition, the reactant gas stream flows from a gas input port 328, across a preheat ring 324, where the gases are heated, across the surface of the substrate 100 in the direction of the arrows 330 to deposit silicon films thereon, and out through exhaust port 332. The gas input port 328 is connected, via conduit 334, to a gas supply represented by tanks 336 that provides one or a mixture of gases. The gas concentrations and/or flow rate through the conduit 334 and each of the ports ports 328 and 332, are selected to produce processing gas flows and concentration profiles that optimize processing uniformity. Although the rotation of the substrate and the thermal gradients caused by the heat from lamps 326 can significantly affect the flow of the gases in the reactor 300, the dominant shape of the flow profile is a laminar flow from the gas input port 328 and across the preheat ring 324 and the substrate 100 to exhaust port 332.

According to the preferred embodiment of the present invention, the reactant gases comprise a silicon containing gas, a diluted dopant gas, and a carrier gas. According to the present invention, the silicon containing gas is fed into process chamber 319 to produce a relatively high silicon containing gas partial pressure of greater than 4 torr and less than 40 torr, with a partial pressure between 10–20 torr being preferred. A relatively high flow rate of between 500–1500 sccm, with approximately 900 sccm being preferred of silicon containing gas is utilized. The high silicon containing gas partial pressure increases the deposition rate of the film. Too high of a partial pressure of silicon containing gas, however, can lead to particles and silicon deposition on chamber sidewalls. The silicon containing gas is preferably silane ($SiH_4$), but may be other silicon containing gas, such as but not limited to, disilane ($Si_2H_6$), dichlorosilane ($SiCl_2H_2$), trichlorosilane ($SiCl_3H$), and tetrachlorosilane ($SiCl_4$).

According to the present invention, a dopant gas is preferably included in the reactant gas mix in order to produce an insitu doped silicon film. A dopant gas is fed into reaction chamber 319 to produce a dopant gas partial pressure of between 0–0.02 torr, with 0.015 torr being preferred. (It is to be appreciated that the resistivity of the deposited silicon film is inversely proportional to the dopant gas/silicon gas concentration ratio. The higher the dopant gas/silicon gas concentration ratio, the lower the resistivity of the film). A relatively low dopant gas partial pressure (less than 0.02 torr) can be used in the present invention because the relatively low process temperature and high deposition pressure employed in the present invention increase the incorporation of dopant in the silicon film. As mentioned above, addition of a dopant gas decreases the step coverage of the film. By keeping the deposition temperature relatively low in the present invention, less dopant gas is necessary to produce a low resistivity film than is necessary to produce a similar resistivity film at higher temperatures. In this way, step coverage of a doped silicon film is improved. The present invention preferably utilizes a dopant gas flow rate of between 0.10–2.0 sccm, with 1.0 sccm being preferred. The dopant gas is preferably diluted in a carrier gas such as hydrogen, to form a 1% diluted dopant gas (i.e. diluted dopant gas=1% dopant gas and 99% carrier gas). The diluted dopant gas is fed into reaction chamber 319 at a rate between 10–200 sccm and preferably at a rate of 100 sccm. Phosphine ($PH_3$) is the preferred dopant gas, but other dopant gases, such as but not limited to, arsine ($AsH_3$) may be used, if desired.

The silicon containing gas and the diluted dopant gas are fed into reaction chamber 319 with a carrier gas, such as but not limited to, hydrogen, helium, argon, and nitrogen. The silicon containing gas and the diluted dopant gas are added to a carrier gas which flows into reaction chamber 319 at a rate of between 4–12 slm (standards liter per minute) and preferably at a rate of 8 slm.

Reactant gases are fed into reaction chamber 319, until a silicon film 104 of a desired thickness (T) is deposited over substrate 100. Next, as shown in block 208, substrate 100 can be annealed, if desired. Substrate 100 can be annealed in order to convert the as deposited amorphous silicon or amorphous/polysilicon film 104 into low resistance polycrystalline silicon. In this way, an amorphous silicon film can be deposited at a relatively low temperature, in order to improve the step coverage of the film and ensure complete hole filling, and subsequently be converted by annealing into a low resistance polycrystalline silicon film. Any well known method and equipment can be utilized to anneal substrate 100. For example, substrate 100 can be annealed in the furnace at about 850° C. for 30 minutes in a nitrogen ambient. Although annealing substrate 100 requires an additional step, many integrated circuit manufacturing processes, such as DRAM processes, require subsequent anneals for other purposes, such as silicide formation, and so the anneal step can be included without affecting throughput. Utilizing the anneal step of the present invention allows a low resistance polycrystalline film to be formed in a high aspect ratio opening without void formation.

The process of the present invention can form a high quality polysilicon or amorphous silicon film with a high dopant density ($>2\times10^{20}/cm^3$) and therefore, a low resistivity (between 0.7–1.0 m$\Omega$-cm) at a high deposition rate (between 500–1200 Å/minute) and with excellent step coverage (between 80–95%). The present invention can be reliably used to fill openings in substrate 100 having a width$\geq$0.28 microns and an aspect ratio$\geq$2.0 at a high deposition rate without creating voids therein.

Another novel feature of the present invention is a novel empirical relationship between step coverage and a unique parameter X, where X is defined as:

$$X = \frac{(\text{Silicon Gas})_{pp}}{(\text{Dopant Gas})_{pp}^{\delta} \times Rd}$$

wherein:

(Silicon Gas)$_{PP}$=silicon containing gas partial pressure, (Dopant Gas)$_{PP}$=dopant gas partial pressure, $\delta$=0.7–0.85, and Rd=the deposition rate.

The larger the value of X, the better is the step coverage of the deposition process. For a given deposition process, step coverage can be improved by increasing the silicon gas partial pressure, decreasing dopant gas partial pressure, decreasing the deposition rate or combinations thereof. The deposition rate (Rd) itself depends on deposition conditions of temperature, pressure, and silicon and dopant gas partial pressure, however, it is a value that can be controlled and measured. Additionally, due to the CVD process, the dopant concentration in the film is a power law of dopant gas concentration with a power constant δ. (The power constant δ will typically be from 0.7–0.85 and under the conditions of the present invention about 0.75. The power constant δ can be determined by measuring the silicon to dopant concentration in the film, using for example a SIMS method, for different silicon to dopant gas concentrations in the reactant gas mix. A plot of silicon to dopant concentration in the film vs. silicon to dopant concentration in the gas mix can then be generated with the resulting slope or ratio of the plot being the power constant δ). The novel relationship between step coverage and a single parameter X, which consists of all the deposition parameters, can be utilized to optimize deposition conditions for a particular process. That is, the deposition rate, film resistivity, and step coverage of a deposited silicon film can be tailored, according to the single parameter X defined above, to optimize the film deposition process to meet specific integrated circuit manufacturing requirements.

Figure 4:
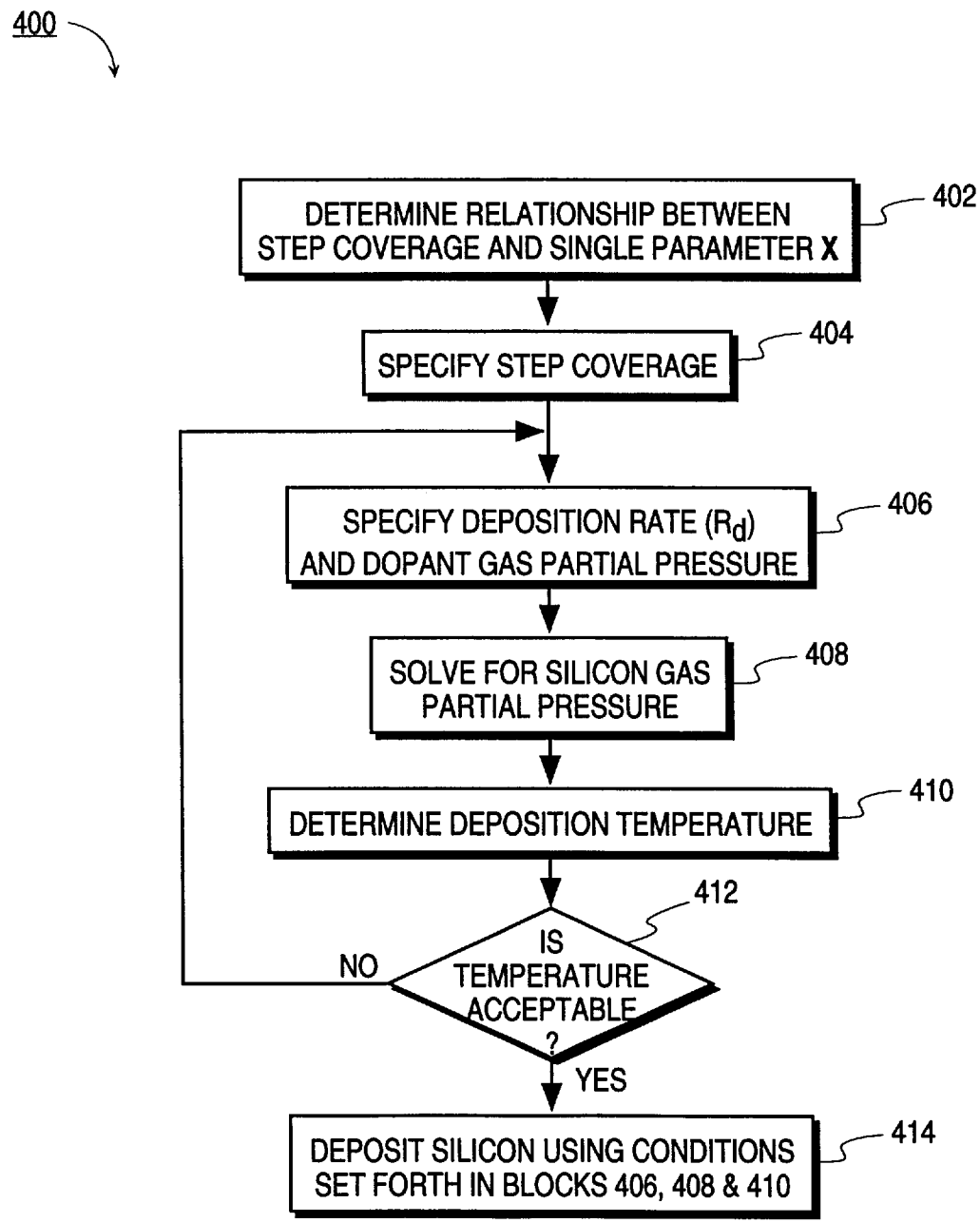
FIG. 4 is a flow chart which illustrates a method of optimizing a silicon deposition process for particular manufacturing requirements
Figure 5A:
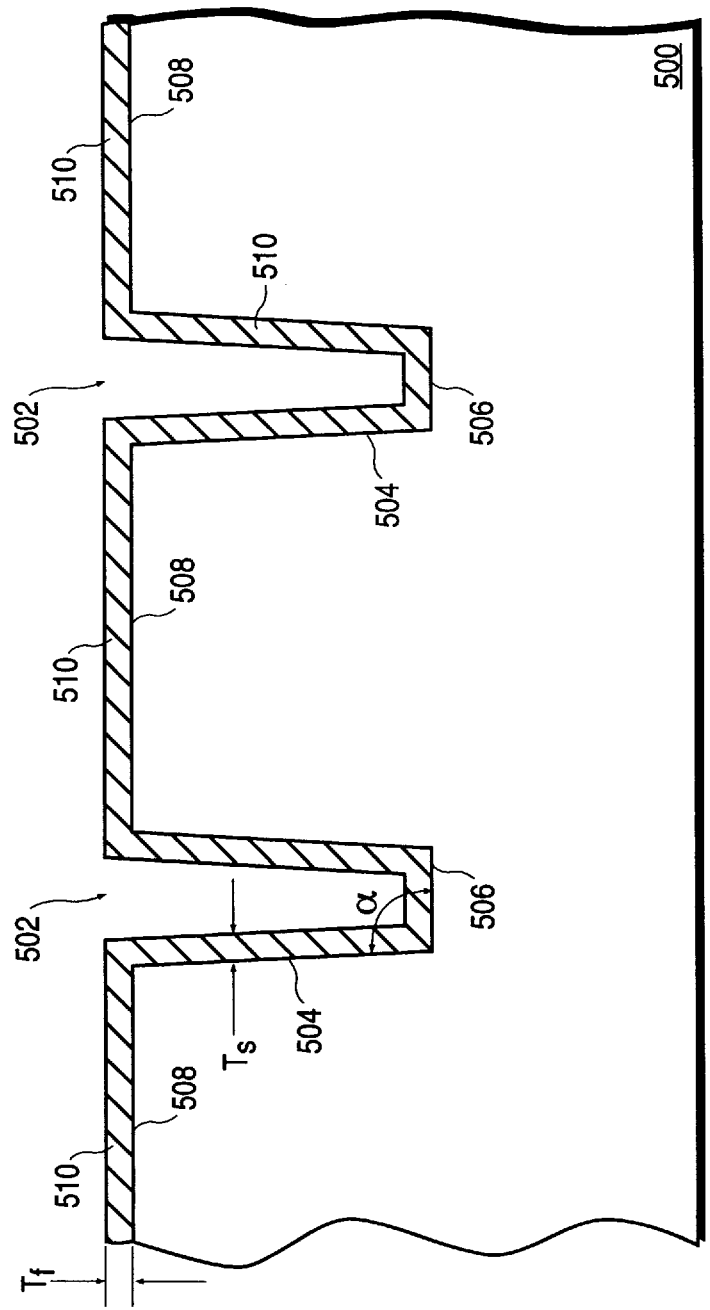
FIG. 5*a* is a cross-sectional view of a substrate having a high aspect ratio opening with tapered sidewalls.

A method of optimizing deposition conditions of the present invention for specific manufacturing requirements utilizing the single parameter X of the present invention is set forth in flow chart 400 of FIG. 4. The first step, as set forth in block 402, is to determine the relationship between the single parameter X and step coverage for a specific substrate pattern or topography. This can be accomplished, for example, by depositing a film 510 under a first set of conditions (i.e. silicon gas partial pressure and dopant gas partial pressure) over a substrate, such as substrate 500 shown in FIG. 5a. The deposition rate and step coverage can then readily be determined by direct measurement. It is to be recalled that step coverage is defined as:

$$\text{Step Coverage} = \frac{T_S}{T_F} \times 100\%$$

where $T_S$ equals film thickness on a step surface (i.e. sidewall 504) and where $T_F$=the nominal film thickness on a flat surface (i.e. surface 508).

The value of X is then calculated utilizing the equation defined above (i.e. X is solved for utilizing the dopant gas partial pressure, silicon gas partial pressure, and the deposition rate). The Step Coverage for the value of X is then recorded as a point on a Step Coverage vs. X graph. This process is then repeated a number of times on a substrate with similar patterns to obtain additional step coverage values for different values of X (i.e. different process conditions). After a sufficient number of Step Coverage/X points are obtained (at least three), a plot 602 defining the relationship between Step Coverage and the single parameter X can be generated for the specific substrate pattern.

Figure 5B:
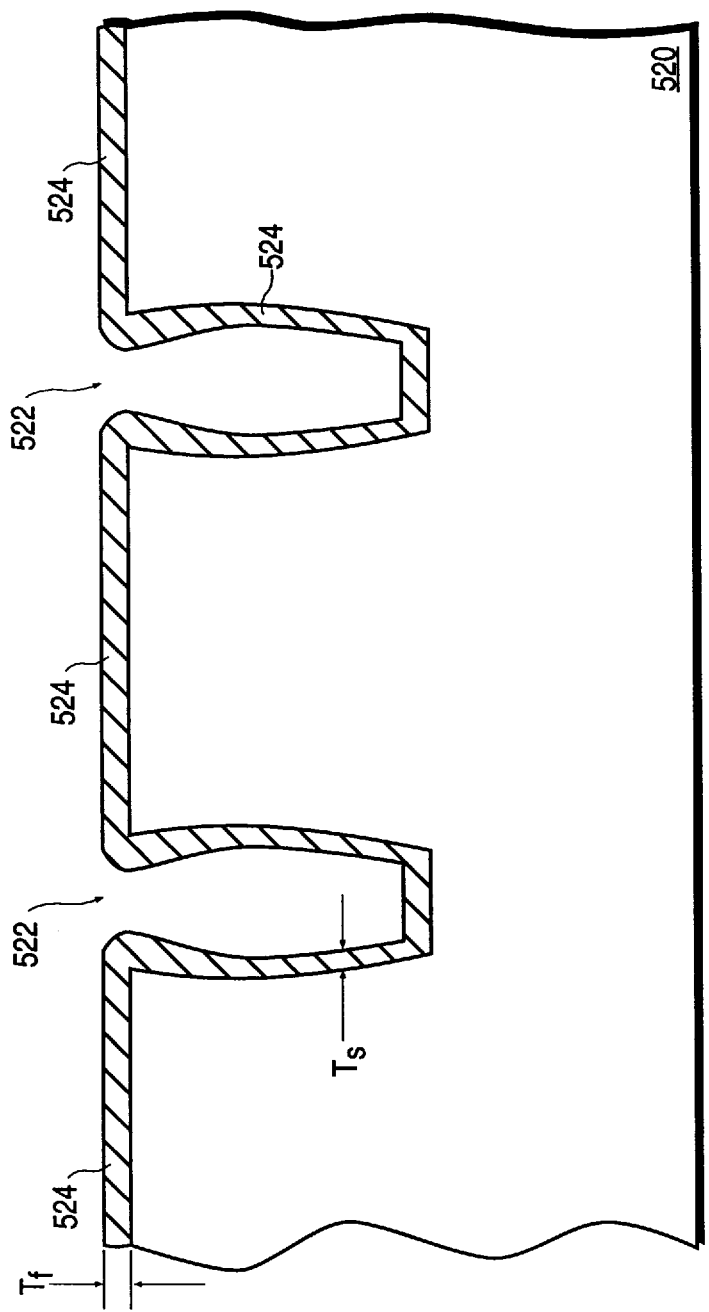
FIG. 5b is a cross-sectional view of a substrate having a high aspect ratio opening with a wide middle portion.

It is to be appreciated that a different plot of Step Coverage vs. X should be generated for each different substrate pattern. This is because step coverage, for a given set of process conditions, will vary depending upon the specific substrate pattern or topography. For example, substrate 500 shown in FIG. 5a has openings 502 with tapered sidewalls 504. That is, each opening 502 has sidewalls 504 angled at about 94° (α) from the bottom 506 of opening 502. Slightly inclining the sidewall 504 improves step coverage of a film for a given process as compared to an opening having 90° angle. Some substrate patterns, such as substrate 520 shown in FIG. 5b, which have openings 522 which are wider in the middle than at the bottom or the top, are very difficult to obtain good step coverage no matter what process conditions are utilized. As such, a silicon film 524 formed on these substrates will exhibit a lower step coverage for a given value of X than on a substrate with an easy to fill pattern, such as substrate 500. Since the step coverage for a given set of process conditions (i.e. value X) will vary depending upon the substrate pattern or topography, it is necessary to generate a different plot for each different substrate pattern.

Figure 6A:
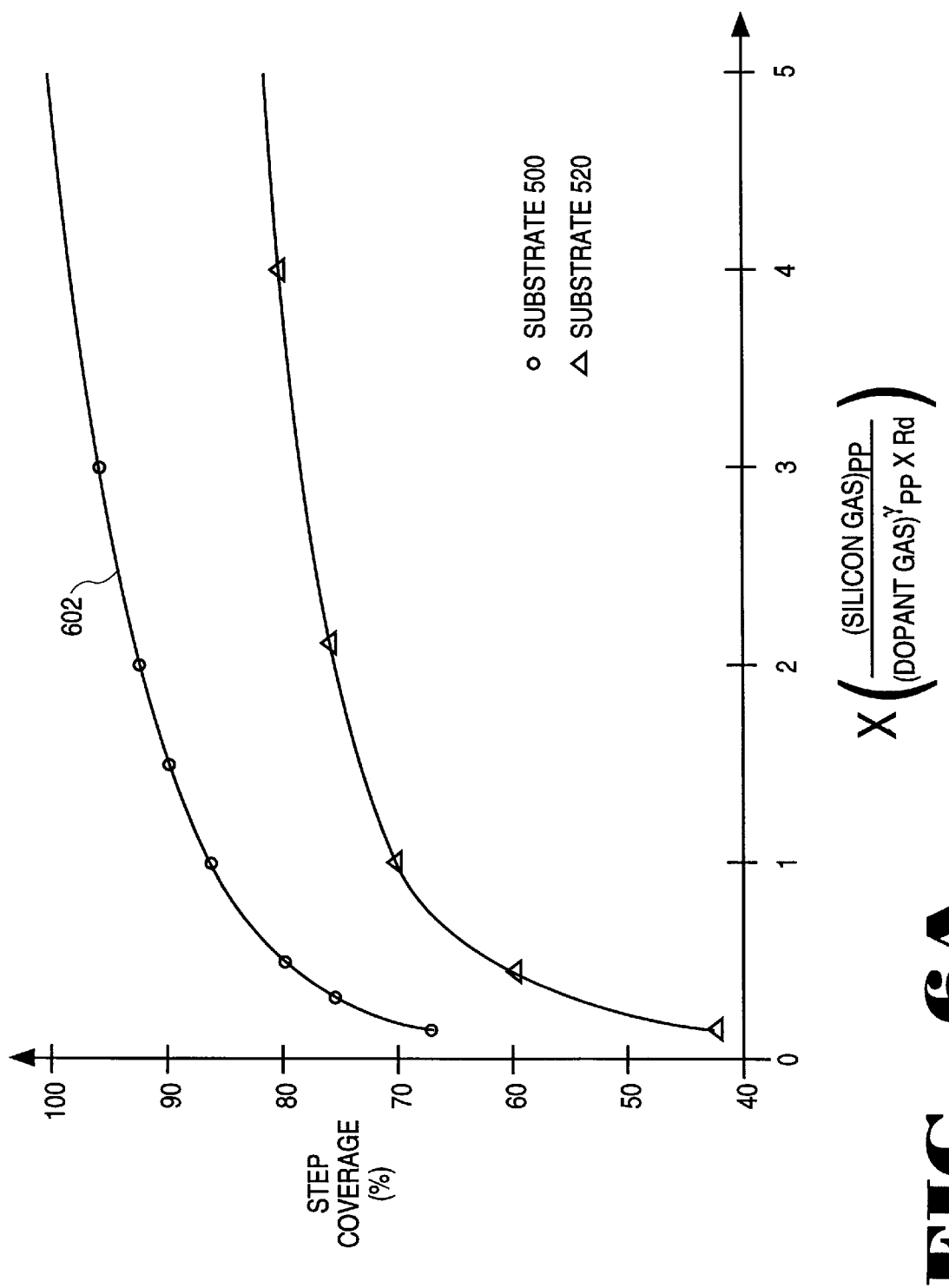
FIG. 6a is an illustration of a graph depicting the relationship between step coverage and the single parameter X for two different substrate patterns.

Next, as set forth in block 404, a Process Engineer determines what step coverage will be required in order to adequately fill the openings 502 in substrate 500. Once a step coverage is specified, as set forth in block 406, the plot shown in FIG. 6a is utilized to determine the value of X which will obtain the specified step coverage.

Figure 6B:
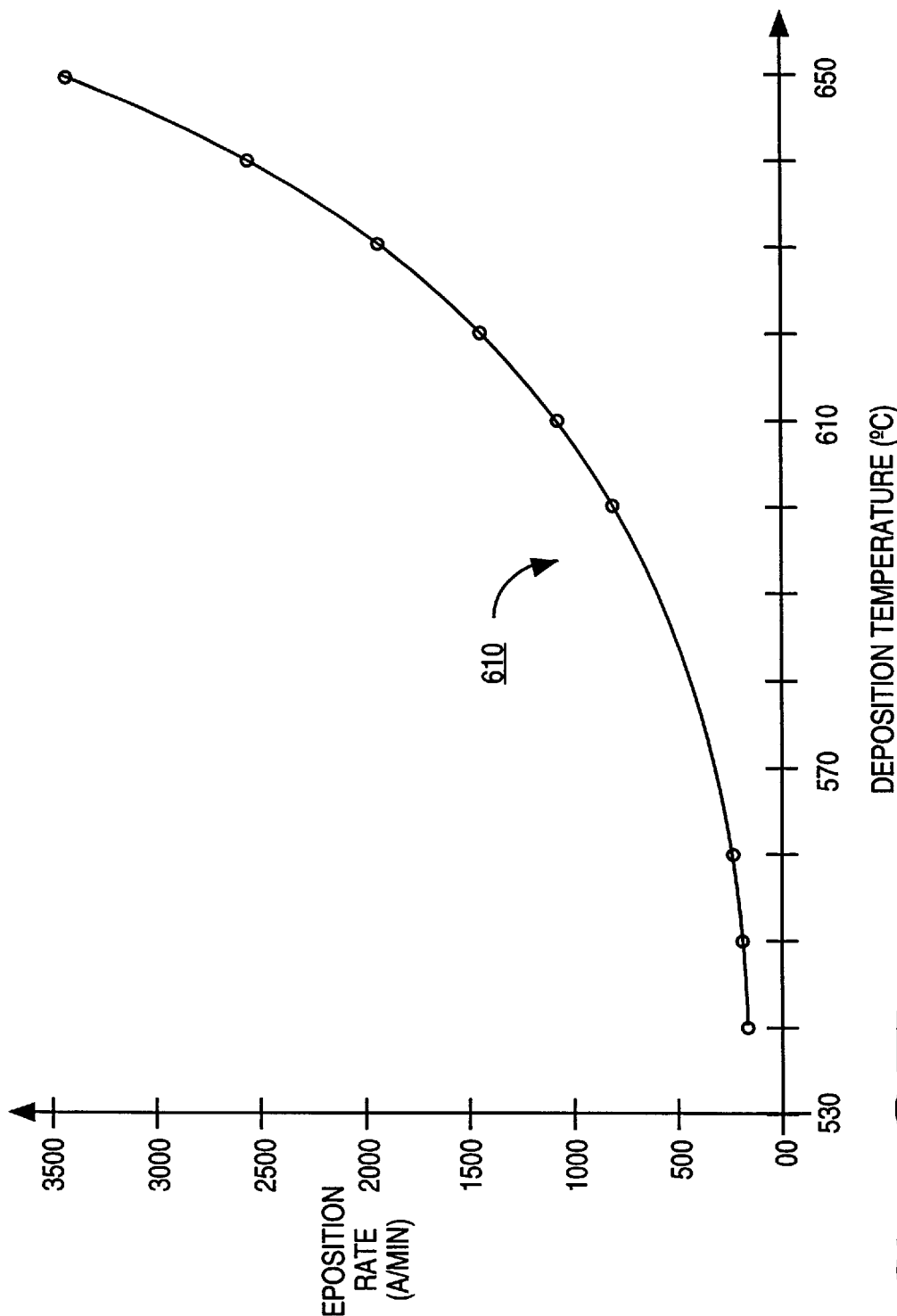
FIG. 6b is an illustration of a graph depicting the relationship between deposition rate (Rd) and deposition temperature for a given deposition process.

Next, as set forth in block 406, a deposition rate for the process is specified. The deposition rate (Rd) will typically be dictated by the throughput (number of wafers processed/time) which makes the process most cost effective. Additionally, at this time, the dopant gas partial pressure is specified. The dopant gas partial pressure will be dictated by the resistivity desired of the silicon film. Once the deposition rate, dopant gas partial pressure, and value of X are specified, the silicon containing gas partial pressure can be solved for by utilizing Applicant's novel equation (X), as set forth in block 408. It is to be noted that gas flow rates may be utilized instead of partial pressures, if desired, since the partial pressure of a gas is related to its flow rate. That is, the partial pressure of a $$(\text{Gas } A)_{pp} = \frac{\text{Gas } A \text{ Flow Rate}}{\text{Total Flow Rate}} \times (P_T)$$

wherein:

Gas A Flow Rate=Flow Rate of Gas A,

Total Flow Rate=total of flow of all gas into reaction chamber, and $P_T$=Total Pressure in Reaction Chamber Next, as set forth in block 410, the deposition temperature of the process is determined. The deposition temperature can be determined by first generating a plot 610 of Deposition Rate vs. Deposition Temperature, as shown in FIG. 6b. A plot 610 can be generated by holding constant the conditions set forth in blocks 406 and 408 and then measuring the different growth rates of the films formed at different temperatures. At least three different temperature/growth rate points should be utilized to generate the graph shown in FIG. 6b. Next, as set forth in block 412, the Deposition Rate vs. Temperature graph of FIG. 6b is utilized to determine the temperature necessary to obtain the deposition rate specified in block 408. If the deposition temperature determined from the graph of FIG. 6b is within the specified temperature range of 550°–620° C., the temperature is acceptable and, as set forth in block 414, the process conditions are set as determined in blocks 406, 408, and 410. If the temperature required to obtain the desired deposition rate is outside of the acceptable range, however, then the conditions specified in block 406 must be reevaluated. That is, the deposition rate or doping density requirements must be relaxed in order to obtain a feasible process. Thus, not only can the single parameter X of the present invention be utilized to optimize deposition conditions, but it can also be used to determine whether or not a process is even feasible.

The single parameter X and optimization process of the present invention can be used to set deposition conditions for a silicon deposition process to maximize the manufacturability of the process. For example, if a silicon film is to be deposited on a substrate which has difficult to fill openings, such as substrate 100 with high aspect ratio (≧2:1) openings 102 having a width (W)≦0.5 μm, a depth of 1.2 μm and vertical (90°) sidewalls, the relationship between step coverage and the single parameter X indicates that the deposition rates and/or doping density should be reduced in order to maximize the step coverage (>95%) of the deposited film to ensure complete hole filling. That is, when difficult to fill openings are encountered, deposition conditions should be chosen to increase the value of X in order to increase the step coverage. A silicon film deposited at a temperature of approximately 590° C., at a deposition pressure of approximately 200 torr, a silane partial pressure of approximately 16.5 torr (silane flow of 900 sccm), a phosphine partial pressure of approximately 0.0037 torr (a 1% hydrogen diluted phosphine flow of 20 sccm) and a total hydrogen flow of 10 slm can be used to produce a medium doped (approximately $5.6 \times 10^{19}/cm^3$) silicon film at a deposition rate of approximately 500 Å/minute with a step coverage >95% which can completely fill openings 102 in substrate 100.

Figure 1C:
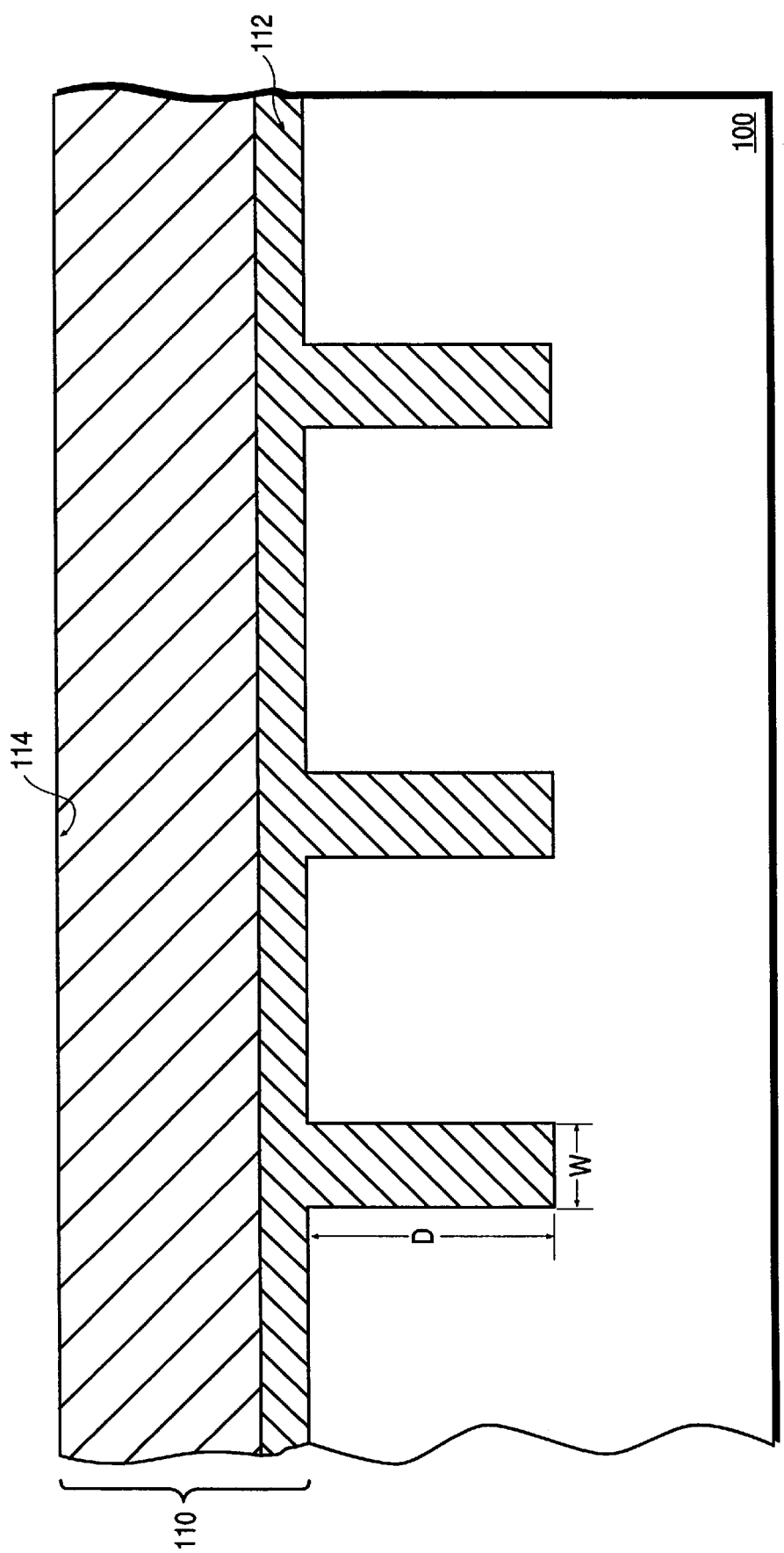
FIG. 1*c* is an illustration of a cross sectional view showing the formation of a dual layer silicon film over the substrate of FIG. 1*a*.

If a silicon film is to be deposited on a substrate having easy to fill openings or features, such as substrate 500 which has openings 502 having a width of 0.32 microns and a depth of 0.8 microns and with 94° incline sidewalls 504, then the relationship between step coverage and the single parameter X indicates that the deposition rate and/or doping density of the film can be increased since step coverage requirements are reduced. That is, when an easy to fill substrate is encountered, deposition conditions which provide lower values of X can be utilized because step coverage requirements are lessened. A silicon film 510 can be deposited onto substrate 500 at a high deposition rate (approximately 1100 Å/minute) and with a high doping density ($>2.0 \times 10^{20}/cm^3$) and completely fill openings 502 by utilizing the deposition conditions of: silane partial pressure of approximately 13 torr (silane flow rate of approximately 900 sccm), a phosphine partial pressure of approximately 0.015 torr (1% hydrogen diluted phosphine flow of approximately 100 sccm), a deposition temperature of approximately 620° C., and a deposition pressure of approximately 160 torr. Additionally, the relationship between step coverage and the single parameter X can be utilized to design processes where double layer or multilayer silicon films are deposited into high aspect ratio openings ($\geq 2.0$) in order to improve throughput of the silicon deposition process. For example, say a particular IC manufacturing process requires an 8000 Å thick(T) silicon film 110, and requires the complete filling of an opening 102 having a width (W) of 0.25 microns and a depth (D) of 7500 Å (aspect ratio approximately 3.0). In such a process, as shown in FIG. 1c, a first layer of medium doped amorphous silicon (low temperature silicon) layer 112 can be deposited to a thickness of about 1500 Å in order to maximize the step coverage of the film. That is, in the first deposition step, a high silicon containing gas partial pressure (between 4–40 torr) is utilized and the deposition rate and doping level of the film are reduced, as specified by the relationship between step coverage and the single parameter X, in order to maximize the step coverage and ensure complete hole filling. (Only approximately 1250 Å of silicon film is required to fill the opening because the hole fills from the sidewalls, i.e. a film thickness of W/2 is required to fill an opening having a width W). Once the hole has been sufficiently filled and/or step coverage requirements have been relaxed, the bulk of the silicon film 114 (remaining 6500 Å) can be deposited with a process, specified by the equation above, to form a polysilicon layer 114 with high doping at a high deposition rate. In this way, the doping characteristics, step coverage, and deposition rate of each layer 112 and 114 of the composite film 110 are optimized, according to the single parameter X, to suit a particular purpose in order to optimize the entire process. In this way, the novel parameter (X) can be utilized to maximize wafer throughput and ensure complete hole filling under all manufacturing requirements.

The single substrate reactor of the present invention preferably includes software stored in a non-volatile memory, such as a ROM, EPROM, etc., which is machine readable and executable by a processor, such as a microprocessor. The software is used to control various devices such as pumps, lamps, values, and mass flow controllers in the reactor to produce desired deposition conditions. The software preferably includes an algorithm or subroutine which utilizes a relationship between step coverage and the single parameter X, to help an operator optimize and implement a silicon deposition process to meet specific manufacturing requirements. The software can be utilized to determine the ideal gas partial pressures (or flow rates) and dopant profiles necessary to meet manufacturing requirements. The software and processor can be utilized to control the gas flows and other process parameters, such as temperature and pressure, to carry out an optimal silicon film deposition process.

The present invention has described a novel process of forming a silicon film at a high deposition rate with improved step coverage in a single substrate reactor. The present invention has also described a method and a single parameter which can be utilized to determine optimal process conditions in order to optimize a deposition process for particular manufacturing requirements. Although the present invention has been described with respect to specific examples, these examples are to be taken as illustrated rather than limiting wherein the scope of the present invention is to be determined by the appended claims which follow. Thus, a novel method and apparatus for forming a uniform, low resistivity, silicon film at a high deposition rate and with improved step coverage has been described.

We claim:

1. A method of forming a silicon film on a substrate, said method comprising the steps of:
    placing said substrate in a reaction chamber said substrate having an opening with an aspect ratio of at least 2:1;
    substantially filling said opening with a doped silicon layer utilizing a deposition process comprising:
    generating a deposition pressure between 20–300 torr in said reaction chamber;
    heating said substrate to a temperature between 550°–620° C.;
    flowing a silicon containing gas into said reaction chamber to obtain a silicon containing gas partial pressure in said reaction chamber of between 4 to 40 torr;
    flowing a dopant gas into said reaction chamber to obtain a dopant gas partial pressure of $\leq 0.020$ torr; and
    continuing said flow of said silicon containing gas and said flow of said dopant gas into said reaction chamber until said opening is substantially filled with said doped silicon layer.

2. The method of claim 1 wherein said dopant gas is phosphine.

3. The method of claim 1 wherein said silicon containing gas is selected from the group consisting of $SiH_4$, $Si_2H_6$, $SiH_2Cl_2$, $SiCl_3H$, and $SiCl_4$.

4. The method of claim 3 wherein said silicon containing gas is $SiH_4$.

5. The method of claim 1 further comprising the step of:
    flowing between 4–12 slm of $H_2$ into said reaction chamber.

6. A method of forming a doped silicon layer on a substrate, said method comprising the steps of:

placing said substrate in a reaction chamber said substrate having an opening with an aspect ratio of at least 2:1;

substantially filling said opening with a doped silicon layer utilizing a deposition process comprising:

generating a deposition pressure between 150–200 torr in said reaction chamber;

heating said substrate to a temperature between 590°–600° C.;

flowing a silicon containing gas into said reaction chamber to obtain a silicon containing gas partial pressure in said reaction chamber of between 10–20 torr;

flowing a dopant gas into said reaction chamber to obtain a dopant gas partial pressure of $\leq 0.020$ torr; and continuing said flow of said silicon containing gas and said flow of said dopant gas into said reaction chamber until said opening is substantially filled with said doped silicon layer.

7. The method of claim 6 further comprising the step of:

flowing between 4–12 slm of $H_2$ into said reaction chamber.

8. The method of claim 6 wherein said steps of flowing said silicon containing gas and flowing said dopant gas produce a gas mix having a dopant gas to silicon containing gas ratio of less than or equal to 0.01.

9. The method of claim 6 wherein said dopant gas is phosphine and said dopant gas partial pressure is approximately 0.015 torr.

10. A method of forming a doped silicon film, said method comprising the steps of:

placing a wafer in a reaction chamber said wafer having an opening with an aspect ratio of at least 2:1;

providing a relationship between step coverage of a silicon film over said opening and deposition conditions comprising silicon containing gas partial pressure in said reaction chamber, dopant gas partial pressure in said reaction chamber, and deposition rate of said silicon film wherein said relationship is the relationship between step coverage and a value X where:

$$X = \frac{(\text{Silicon Gas})_{pp}}{(\text{Dopant Gas})_{pp}^{\delta} \times Rd}$$

wherein:
(Silicon Gas)$_{pp}$=silicon gas partial pressure,
(Dopant Gas)$_{pp}$=dopant gas partial pressure
$\delta=0.7–0.85$, and
Rd=the deposition rate;

utilizing said relationship to set a dopant gas partial pressure, and a silicon containing gas partial pressure; and depositing said doped silicon film utilizing said silicon containing gas partial pressure and said dopant gas partial pressure to fill said opening.

11. A method of determining deposition conditions of a silicon film to be deposited on a patterned substrate having an opening, said method comprising the steps of:

a) providing a relationship between step coverage over said opening and deposition conditions comprising silicon gas partial pressure, dopant gas partial pressure, and deposition rate, for said silicon film formed on said patterned substrate wherein said relationship between step coverage and deposition conditions is the relationship between step coverage and a value X where:

$$X = \frac{(\text{Silicon Gas})_{pp}}{(\text{Dopant Gas})_{pp}^{\delta} \times Rd}$$

wherein:
(Silicon Gas)$_{pp}$=silicon gas partial pressure,
(Dopant Gas)$_{pp}$=dopant gas partial pressure,
$\delta=0.7–0.85$, and
Rd=the deposition rate;

b) specifying a first deposition rate and a first dopant gas partial pressure for said deposition of said silicon film;

c) specifying a step coverage of said film;

d) determining a silicon containing gas partial pressure from said relationship defined in step (a) and said dopant gas partial pressure and said first deposition rate defined in step (b);

e) determining the relationship between deposition rate of silicon film and deposition temperature utilizing said silicon gas partial pressure determined in step (d) and dopant gas partial pressure specified in step (c) to deposit said silicon film; and f) determining a first deposition temperature of said silicon film utilizing said deposition rate specified in step (b) and said relationship between growth rate and deposition temperature defined in step (e).

12. The method of claim 11 further comprising the step of:

determining whether said first deposition temperature of step (f) is within a specified range, and if not, then specifying a second deposition rate wherein said second deposition rate is less than said first deposition rate, and repeating steps (c), (d), (e), and (f) to determine a second deposition temperature.

13. The method of claim 11 further comprising the step of:

determining whether said deposition temperature of step (f) is within a specified range, and if not, then specifying a second dopant gas partial pressure wherein said second dopant gas partial pressure is less than said first dopant gas partial pressure, and repeating steps (c), (d), (e), and (f) to determine a second deposition temperature.

14. A method of filling an opening in a substrate having a large aspect ratio with a doped silicon film in a single wafer reactor, said method comprising the steps of:

placing a substrate having an opening with a bottom and a sidewall, said opening having an aspect ratio of at least 2:1 into a single wafer reactor;

depositing a first doped silicon film on said bottom and on said sidewall of said opening utilizing a first deposition pressure, a first deposition temperature, of between 550°–620° C. a first partial pressure of a silicon containing gas between 4–40 torr, and a first partial pressure of a dopant gas to deposit said first silicon film at a first deposition rate; and depositing a second doped silicon film onto said first doped silicon film wherein said second doped silicon film is deposited at a second deposition pressure of between 4–40 torr, a second deposition temperature of between 550°–620° C., a second partial pressure of said silicon containing gas of between 4–40 torr, and a second partial pressure of said dopant gas to produce said second silicon film at a second deposition rate wherein said second deposition rate is greater than said first deposition rate.

15. The method of claim 14 wherein said second deposition temperature is greater than said first deposition temperature.

16. The method of claim 14 wherein said second partial pressure of said dopant gas is greater than said first partial pressure of said dopant gas.

17. The method of claim 14 wherein said second deposition pressure is greater than said first deposition pressure.

18. The method of claim 14 wherein said first silicon film has a greater percentage step coverage over a step than does said second silicon film.

19. The method of claim 14 wherein said second deposition temperature is greater than said first deposition temperature, wherein said second deposition pressure is greater than said first deposition pressure, and wherein said second partial pressure of said dopant gas is greater than said first partial pressure of said dopant gas.

20. The method of claim 19 wherein said first silicon film has a greater percentage step coverage over a step than does said second silicon film.

* * * * *